(12) United States Patent
Yang et al.

(10) Patent No.: US 8,129,842 B2
(45) Date of Patent: *Mar. 6, 2012

(54) ENHANCED INTERCONNECT STRUCTURE

(75) Inventors: Chih-Chao Yang, Poughkeepsie, NY (US); Mukta Ghate Farooq, Hopewell Junction, NY (US); Keith Kwong Hon Wong, Wappingers Falls, NY (US); Haining Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 250 days.

This patent is subject to a terminal disclaimer.

(21) Appl. No.: 12/355,896

(22) Filed: Jan. 19, 2009

(65) Prior Publication Data

US 2009/0200669 A1  Aug. 13, 2009

Related U.S. Application Data

(62) Division of application No. 11/548,298, filed on Oct. 11, 2006, now Pat. No. 7,531,384.

(51) Int. Cl.
H01L 23/522 (2006.01)
(52) U.S. Cl. ................. 257/758; 257/E21.584
(58) Field of Classification Search .......... 257/751–758, 257/E23.142
See application file for complete search history.

(56) References Cited

U.S. PATENT DOCUMENTS

| | | | |
|---|---|---|---|
| 5,098,860 A | 3/1992 | Chakravorty et al. | |
| 5,930,669 A | 7/1999 | Uzoh | |
| 5,933,753 A | 8/1999 | Simon et al. | |
| 6,096,659 A | 8/2000 | Gardner et al. | |
| 6,429,519 B1 | 8/2002 | Uzoh | |
| 6,455,430 B2 | 9/2002 | Abe | |
| 6,475,929 B1 | 11/2002 | Gabriel et al. | |
| 6,566,247 B2 * | 5/2003 | Stumborg et al. | 438/627 |
| 7,088,003 B2 * | 8/2006 | Gates et al. | 257/774 |
| 7,745,324 B1 * | 6/2010 | Yang et al. | 438/618 |
| 2003/0114000 A1 | 6/2003 | Noguchi | |
| 2004/0046261 A1 * | 3/2004 | Ohto et al. | 257/774 |
| 2005/0046031 A1 * | 3/2005 | Engelmann et al. | 257/767 |
| 2005/0093156 A1 | 5/2005 | Naruse et al. | |
| 2005/0112957 A1 | 5/2005 | Yang et al. | |
| 2005/0239395 A1 | 10/2005 | Delegue et al. | |
| 2006/0180920 A1 | 8/2006 | Hasegawa | |
| 2007/0052096 A1 | 3/2007 | Su et al. | |
| 2007/0152335 A1 | 7/2007 | Chun | |
| 2008/0120580 A1 | 5/2008 | Hsu et al. | |
| 2008/0237053 A1 | 10/2008 | Andricacos et al. | |
| 2010/0176514 A1 * | 7/2010 | Yang et al. | 257/761 |

FOREIGN PATENT DOCUMENTS

| | | |
|---|---|---|
| JP | 20020329780 | 11/2002 |
| KR | 1020020090441 | 12/2002 |
| KR | 1020040057513 | 7/2004 |

OTHER PUBLICATIONS

Written Opinion of the International Searching Authority—Form PCT/ISA/210—International Application No. PCT/US2007/081046—Applicant file reference FIS920060110. Extended European Search Report, Sep. 15, 2011.

* cited by examiner

*Primary Examiner* — Nathan Ha
(74) *Attorney, Agent, or Firm* — Jennifer R. Davis; Joseph Petrokaitis

(57) ABSTRACT

The present invention provides a semiconductor interconnect structure with improved mechanical strength at the capping layer/dielectric layer/diffusion barrier interface. The interconnect structure has Cu diffusion barrier material embedded in the Cu capping material. The barrier can be either partially embedded in the cap layer or completely embedded in the capping layer.

10 Claims, 12 Drawing Sheets

ENHANCED INTERCONNECT STRUCTURE

CROSS-REFERENCE TO RELATED APPLICATION

This application is a divisional of currently co-pending U.S. patent application Ser. No. 11/548,298, filed on Oct. 11, 2006, the subject matter of which is incorporated herein by reference in its entirety.

BACKGROUND OF THE INVENTION

The present invention relates to semiconductor integrated circuits (ICs), and more particularly to a back-end-of-the-line (BEOL) interconnect that has a modified structure that enhances the mechanical strength and reliability of the interconnect. The present invention is also related to a method for fabricating the semiconductor IC structure containing the modified interconnect structure.

Damascene processes are well known methods to form metal features such as lines or vias in semiconductor devices. In a typical damascene process a dielectric layer is deposited on a substrate and a portion of the dielectric is etched away in accordance with a mask pattern. The etched areas in the dielectric layer are lined with a barrier metal and then filled with a metal. Excess liner and metal deposited over the dielectric layer is removed in a planarization process.

The vias and lines may be formed in a separate damascene process known as single damascene. To form a layer of metal lines on a substrate, a dielectric layer is deposited and a portion of the dielectric layer is etched away in accordance to a mask pattern which corresponds to the desired line pattern. A metal liner is then deposited on the dielectric layer and in the etched line areas in the dielectric layer. The etched line areas are then filled with a metal and excess metal and liner on top of the dielectric layer is removed in a planarization process. A layer of vias, or vertical connections, are formed in a similar process with a mask pattern corresponding to the desired via pattern. In a single damascene process to form a layer of vias and lines requires two metal fill steps and two planarization steps.

The vias and lines may also be formed in a dual damascene process. A thicker dielectric layer is deposited on a substrate and the dielectric layer is etched according to a mask pattern which corresponds to both the desired via pattern and the desired line pattern. A liner is deposited on the dielectric layer and in the etched areas in the layer. The etched areas are filled with a metal and the excess metal and liner are removed by a planarization process.

FIGS. 1A-1D illustrate various prior art dual damascene structures. Each of the dual damascene structures shown comprises a first dielectric 100 that includes a metal interconnect or line 110 which extends perpendicular to the plane of the paper. The interconnect 110 is surrounded by diffusion barrier materials(s) 105, and a first patterned cap layer 120 is also present on a surface of the first dielectric 100. A second dielectric 130 is located atop the first cap layer 120. The second dielectric 130 has a dual damascene aperture, which includes a lower portion 148 and an upper portion 150, formed therein. The lower portion 148 is referred to in the art as a via, while the upper portion 150 is referred to in the art as a line.

The dielectrics used in each of the levels are typically comprised of silicon dioxide, a thermosetting polyarylene resin, an organosilicate glass such as a carbon-doped oxide (SiCOH), or any other type of hybrid related dielectric. The via 148 makes contact with the underlying interconnect 110, while the line 150 extends over a significant distance to make contact with other elements of the IC as required by the specific design layout. In the drawings, the portion of the cap layer 120 at the bottom of the via 148 has been removed, usually by a different etching chemistry than that used to etch the second dielectric 130. A patterned hard mask 122 is located atop the second dielectric 130.

It is conventional in the prior art to deposit a liner 140 over the entire interior of the structure before metallization. Liner 140 and 105 can be a single layer such as shown in FIG. 1A and FIG. 1C, or multiple layers 140, 145, and 105, 106 as shown in FIGS. 1B and 1D. In FIGS. 1C and 1D, the liner 140 is not located on the bottom horizontal surface of the via 148. The liner 140, 145 is comprised of a refractory metal such as, for example, Ta, Ti, Ru, Ir and W, or a refractory metal nitride such as TaN, TiN, and WN. An optional adhesion layer, not specifically shown, can be used to enhance the bonding of the liner to the second dielectric layer 130. A conductive material (not specifically shown) such as Al, W, Cu or alloys thereof is then deposited so as to completely fill the aperture providing conductively filled vias and conductively filled lines.

One problem with the prior art interconnect structures shown in FIGS. 1A-1D is that it is difficult to obtain a good mechanical contact at normal chip operation temperatures. With continuous scaling and the introduction of low-K dielectrics in Cu interconnects, reliability issues have become a greater concern in addition to increasing process complexity. Additionally, the prior art interconnect structures oftentimes exhibit an open circuit or high resistance joint during reliability testing.

Referring to FIG. 1A it has been observed that the liner 105/cap layer 120/dielectric interface 100 ("three point junction") is a mechanically weak site, and is associated with reliability related problems as shown in FIG. 1E. The dielectric breakdown failure allowing copper diffusion and shorting is a reliability concern which is becoming more critical as IC dimensions become smaller. It has been observed that Cu atoms can diffuse through the Cu/cap layer interface during normal circuit operating conditions.

The weak mechanical strength at this interface can lead to Cu diffusion into the dielectric and cause circuit reliability degradation. This dielectric breakdown is getting worse as the spacing between adjacent interconnects decreases. In addition it is well known that Cu ions can easily diffuse into dielectrics in the absence of barrier materials under the influence of an electric field. It has been observed that Cu ions can diffuse into the dielectric along the Cu/capping layer interface under normal circuit operating conditions.

Therefore, there is a need for providing a new and improved interconnect structure that avoids the problems mentioned above. That is, an interconnect structure is needed that has and maintains good mechanical contact during normal chip operations and does not fail during various reliability tests such as thermal cycling and high temperature baking.

Therefore, an object of the present invention is to provide a structure that enhances the reliability of the interconnection. Another object of the present invention is to provide a novel interconnect structure with Cu diffusion barrier material embedded in the Cu cap material. Another object of the present invention is to provide fabrication methods for creating the novel interconnect structure.

BRIEF SUMMARY OF THE INVENTION

The present invention provides an interconnect structure comprising a dielectric layer with at least one conductive interconnect embedded therein; a diffusion barrier layer surrounding the conductive interconnects and in contact with the dielectric layer and conductive interconnects; a dielectric capping layer in contact with the dielectric layer and conductive interconnects, and a portion of the diffusion barrier layer extending into the dielectric capping layer.

In a preferred embodiment the portion of the diffusion barrier layer extending into the capping layer may extend into only a portion of the dielectric capping layer. In another preferred embodiment the portion of the diffusion barrier layer extending into the capping layer extends into the entire thickness of the dielectric capping layer.

The conductive interconnect features may be lines and/or vias and are preferably Cu, W, Al, or alloys thereof. The dielectric layer preferably has a thickness of approximately 500 Å to approximately 10,000 Å. The diffusion barrier layer is preferably Ta, TaN, Ti, TiN, Ru, RuN, RuTa, RuTaN, W, or WN.

The diffusion barrier layer preferably has a thickness of approximately 4 nm to approximately 40 nm. The dielectric capping layer is preferably $Si_3N_4$, SiC, SiCN, SiC(N,H) or SiCH. The portion of the diffusion barrier layer extending into the dielectric capping layer preferably has a height of approximately 5 nm to approximately 100 nm.

The present invention also provides a method for forming an interconnect structure, comprising the steps of: depositing a sacrificial dielectric film on a dielectric layer; forming patterned features in the dielectric layer; depositing a diffusion barrier layer in the patterned features; depositing a conductive metal on the diffusion barrier layer to form interconnect features; removing a portion of the conductive metal; removing the sacrificial dielectric film; and depositing a dielectric capping layer thereby embedding a portion of the diffusion barrier layer in the dielectric capping layer.

The diffusion barrier layer is preferably deposited by physical vapor deposition, atomic layer deposition, or chemical vapor deposition. The conductive interconnect features are preferably deposited by plating or sputtering. The portion of the conductive metal is preferably removed with a wet etch. In a preferred embodiment the wet etch is a time controlled dip in an etch solution consisting of $HNO_3$, HCL, $H_2SO_4$, HF and combinations thereof.

The sacrificial dielectric film is preferably removed using a wet etch. In a preferred embodiment the wet etch is a dilute HF solution. The dielectric capping layer is preferably deposited by CVD deposition.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1A:
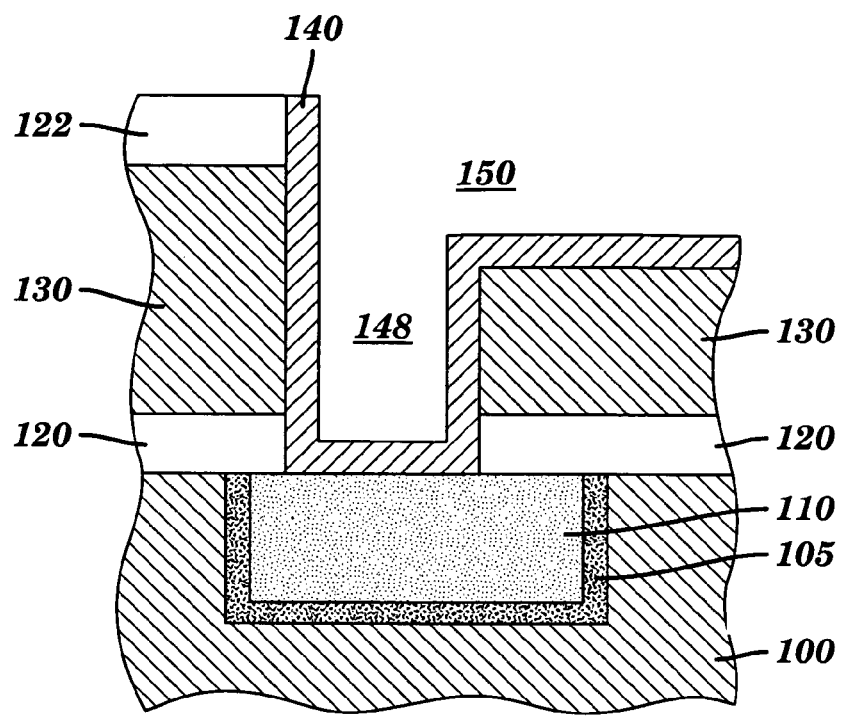
FIGS. 1A-1D are schematic cross-sectional views illustrating a conventional damascene structure.
Figure 1B:
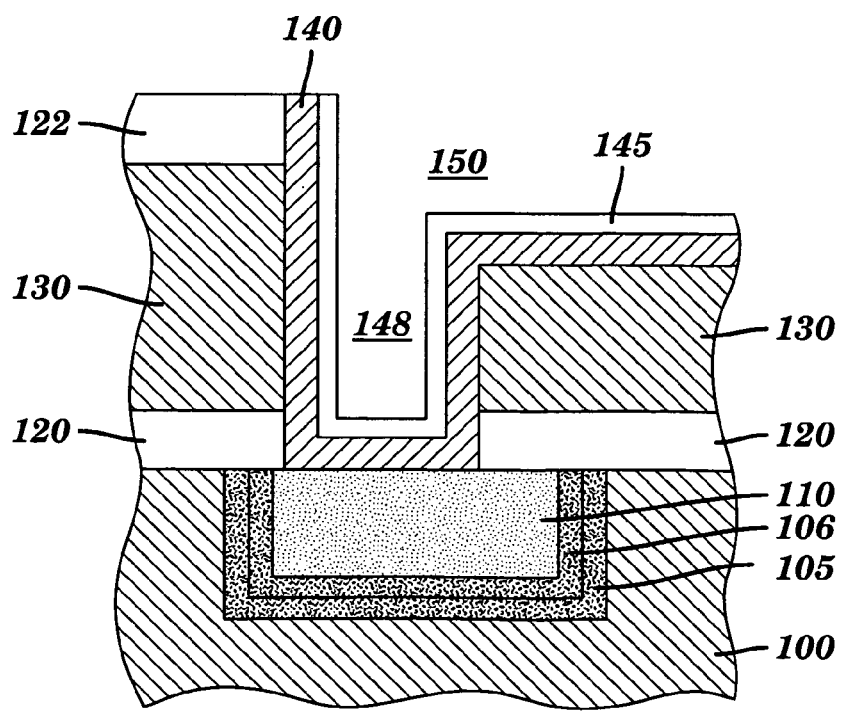
Figure 1C:
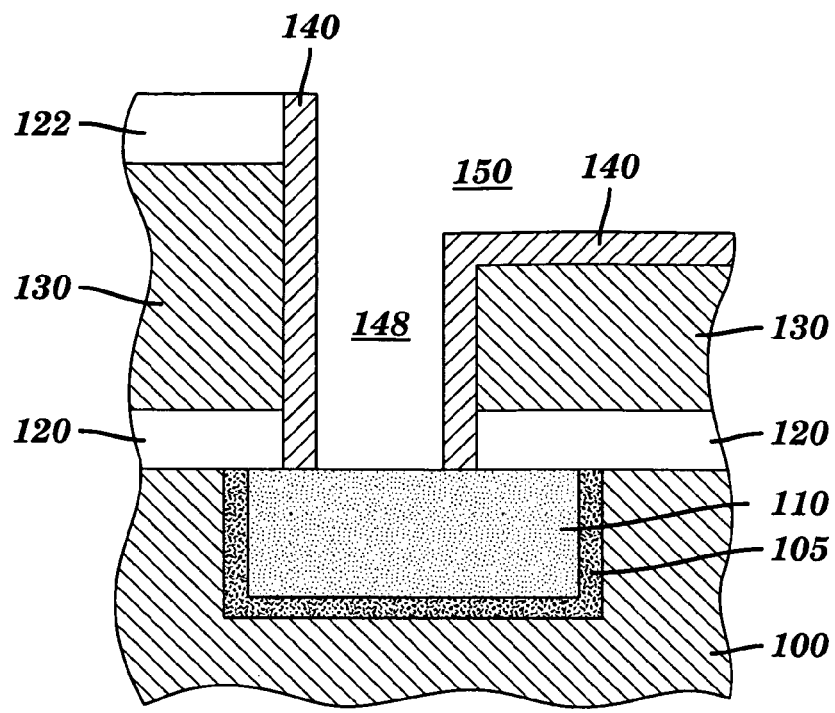
Figure 1D:
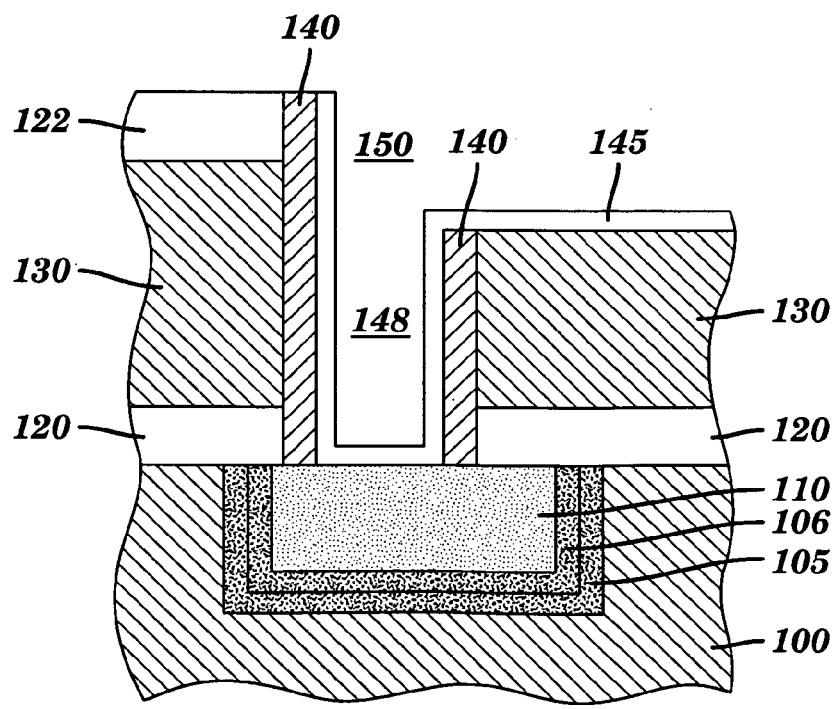
Figure 1E:
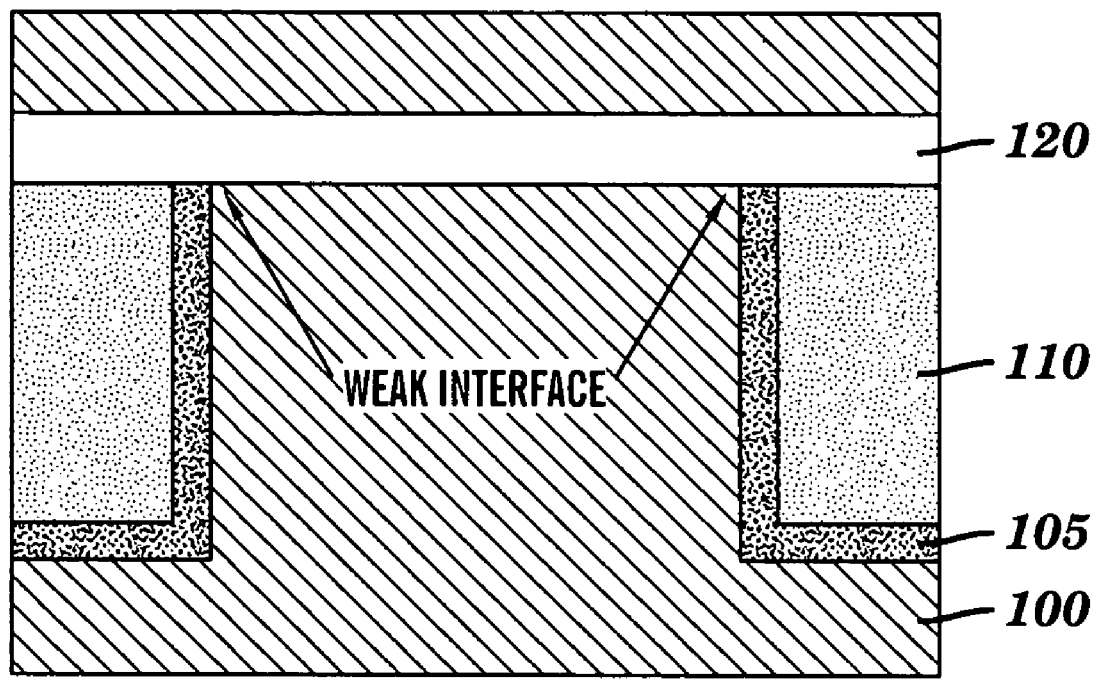
FIG. 1E is a schematic cross-sectional view of a mechanically weak interface.
Figure 2:
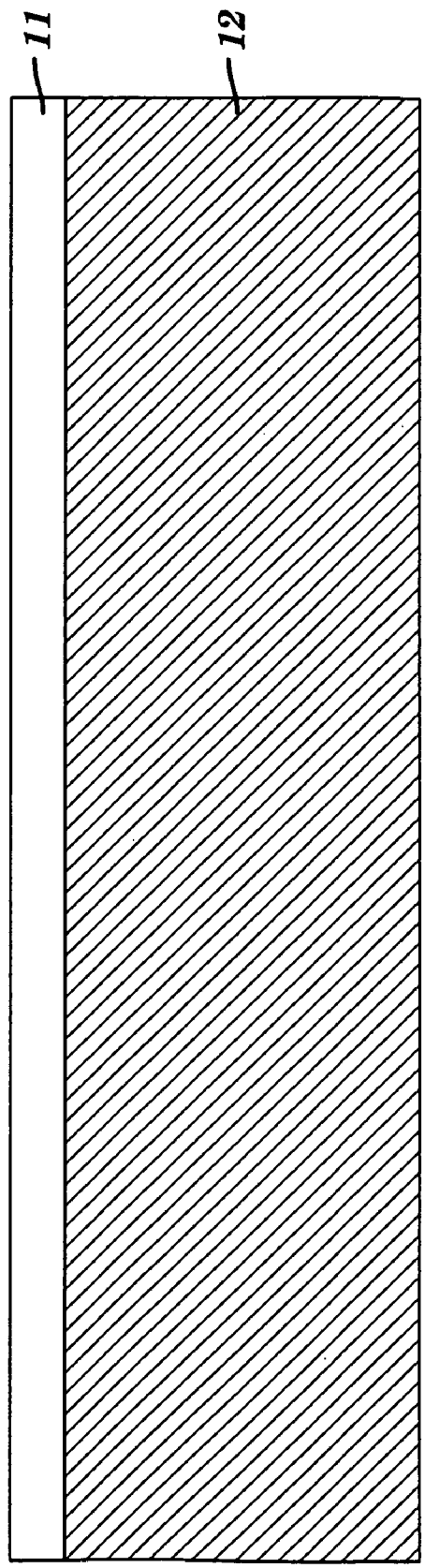
FIGS. 2 through 10 are schematic cross-sectional views illustrating preferred structures according to the present invention.

Referring to FIG. 2 there is shown a sacrificial dielectric film 11 (also commonly referred to as a "hardmask") deposited on an inter-layer dielectric (ILD) layer 12. In a preferred embodiment the sacrificial dielectric film 11 is $Si_3N_4$ or $SiO_2$. The dielectric layer 12 may comprise any interlevel or intralevel dielectric including inorganic dielectrics or organic dielectrics. The dielectric material 12 may be porous or nonporous. Some examples of suitable dielectrics that can be used as the dielectric material include, but are not limited to: $SiO_2$, silsesquioxanes, carbon doped oxides (i.e., organosilicates) that include atoms of Si, C, O and H, thermosetting polyarylene ethers, or multilayers thereof. The term "polyarylene" is used to denote aryl moieties or inertly substituted aryl moieties which are linked together by bonds, fused rings, or inert linking groups such as, for example, oxygen, sulfur, sulfone, sulfoxide, carbonyl and the like. Preferably the sacrificial film 11 has a thickness between 100 Å and 800 Å. Preferably the ILD layer 12 has a thickness between 500 Å and 10,000 Å.

Figure 3:
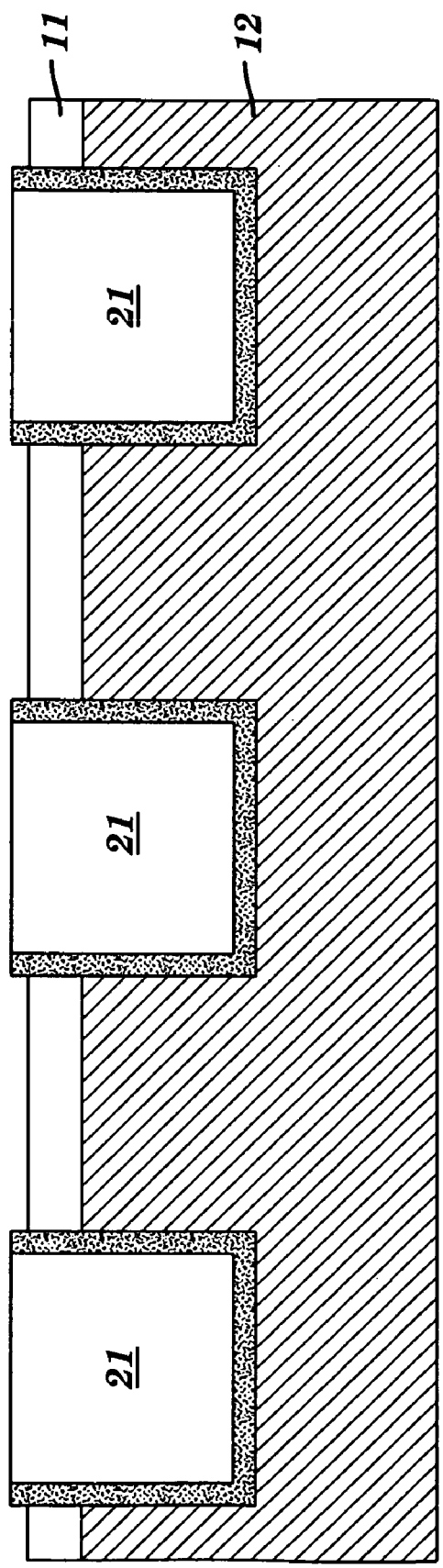

Referring to FIG. 3 patterned features 21 are formed in the ILD layer 12 through conventional lithography and etching processes. These patterned features will correspond to the subsequent interconnect vias or lines depending on whether a single or dual damascene structure is used.

The lithographic step includes applying a photoresist to the surface of the sacrificial dielectric film 11, exposing the photoresist to a desired pattern of radiation, and developing the exposed resist utilizing a conventional resist developer. The etching step may comprise a dry etching process, a wet chemical etching process or a combination thereof. The term "dry etching" is used here to denote an etching technique such as reactive-ion-etching (RIE), ion beam etching, plasma etching or laser ablation. During the etching process, the pattern is first transferred to the sacrificial dielectric film 11 and then into the dielectric material 12. The patterned photoresist is typically, but not necessarily, removed from the structure after the pattern has been transferred into the sacrificial dielectric film 11.

The patterned features 21 formed into the dielectric material 12 may comprise a line opening, via opening or a combination of a line opening and a via opening. A single damascene or dual damascene process can be used as appropriate depending on the type of opening being formed. A first via then line opening process may be used, or a first line then via opening process may be used.

Figure 4:
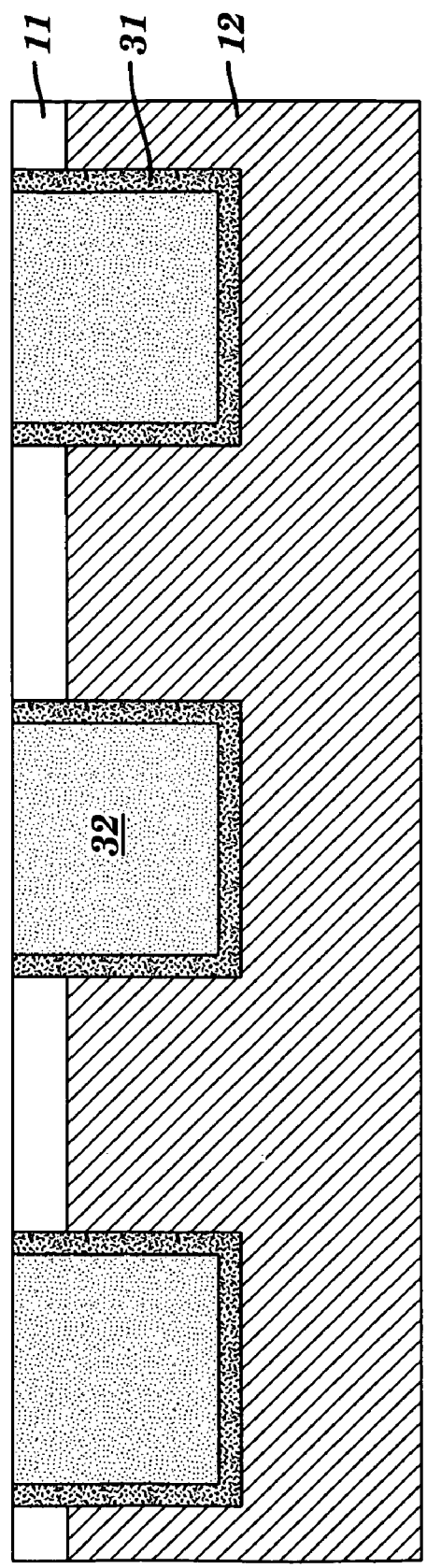

Referring to FIG. 4 there is illustrated the structure after deposition of diffusion barrier layer 31 and conductive interconnect features 32, followed by a chemical-mechanical polish (CMP). The conductive interconnect features 32 are interconnect vias and/or lines depending on whether a single or dual damascene structure is used. The diffusion barrier layer 31 is typically deposited by physical vapor deposition (PVD), atomic layer deposition (ALD), or chemical vapor deposition (CVD) techniques. The conductive interconnect features 32 are preferably plated Cu.

The diffusion barrier layer 31, which may comprise Ta, TaN, Ti, TiN, Ru, RuN, RuTa, RuTaN, W, WN or any other material that can serve as a barrier to prevent conductive material from diffusing through, is formed by a deposition process such as, for example, atomic layer deposition (ALD), chemical vapor deposition (CVD), plasma enhanced chemical vapor deposition (PECVD), sputtering, chemical solution deposition, or plating. The thickness of the diffusion barrier layer 31 may vary depending on the exact means of the deposition process as well as the material employed. Typically, the diffusion barrier layer 31 has a thickness from approximately 4 nm to approximately 40 nm, with a thickness from approximately 7 nm to approximately 20 nm being more typical.

Following the diffusion barrier layer 31 formation, the remaining region of each of the openings 21 within the dielectric material 12 is filled with a conductive material thereby forming conductive interconnect features 32. The conductive material used in forming the conductive interconnect features 32 includes, for example, polySi, a conductive metal, an alloy comprising at least one conductive metal, a conductive metal silicide or combination thereof. Preferably, the conductive material that is used in forming the conductive interconnect features 32 is a conductive metal such as Cu, W or Al, with Cu or a Cu alloy (such as AlCu) being a preferred embodiment in the present invention. The conductive material is filled into the recess features 21 in the dielectric material 12 using a conventional deposition process including, but not limited to: CVD, PECVD, sputtering, chemical solution deposition or plating.

After deposition of the conductive material, a conventional planarization process such as chemical mechanical polishing (CMP) can be used to provide a structure in which the diffusion barrier 31 and the conductive interconnects 32 each have an upper surface that is substantially coplanar with the upper surface of the dielectric material 12. The resultant structure is shown for example in FIG. 4.

Figure 5:
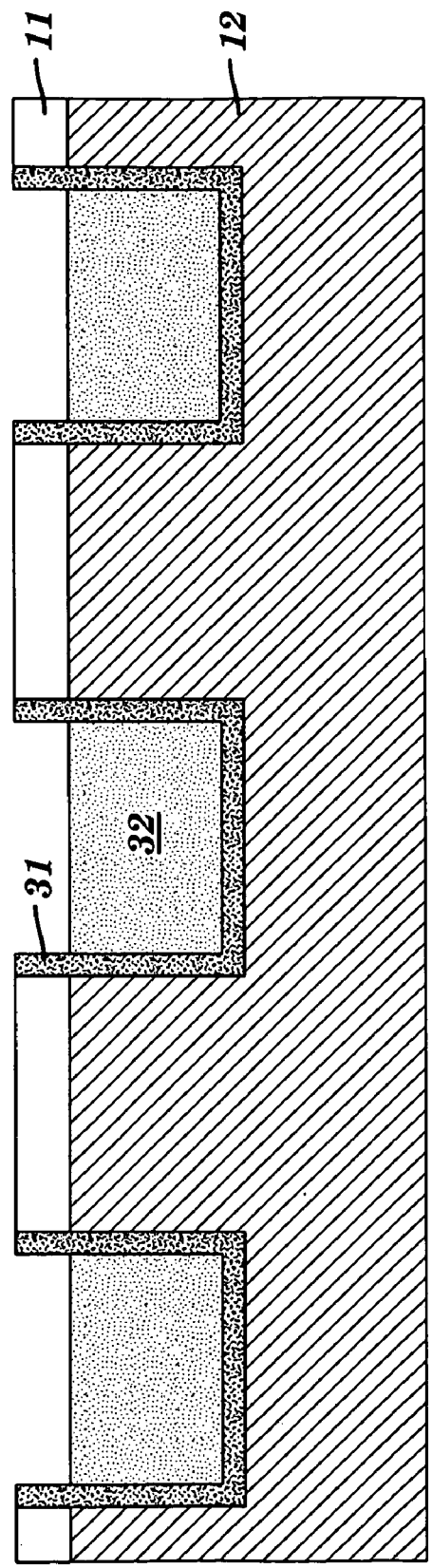

Referring to FIG. 5 the structure is illustrated after a wet etch resulting in the recess of the Cu interconnect features 32. This is preferably a time controlled dip in the etch solution. Preferred etch solutions include $HNO_3$, HCL, $H_2SO_4$, HF or combinations thereof As shown in FIG. 5, only the Cu interconnect 32 will be etched, and not the sacrificial dielectric film 11 or the diffusion barrier layer 31.

Figure 6:
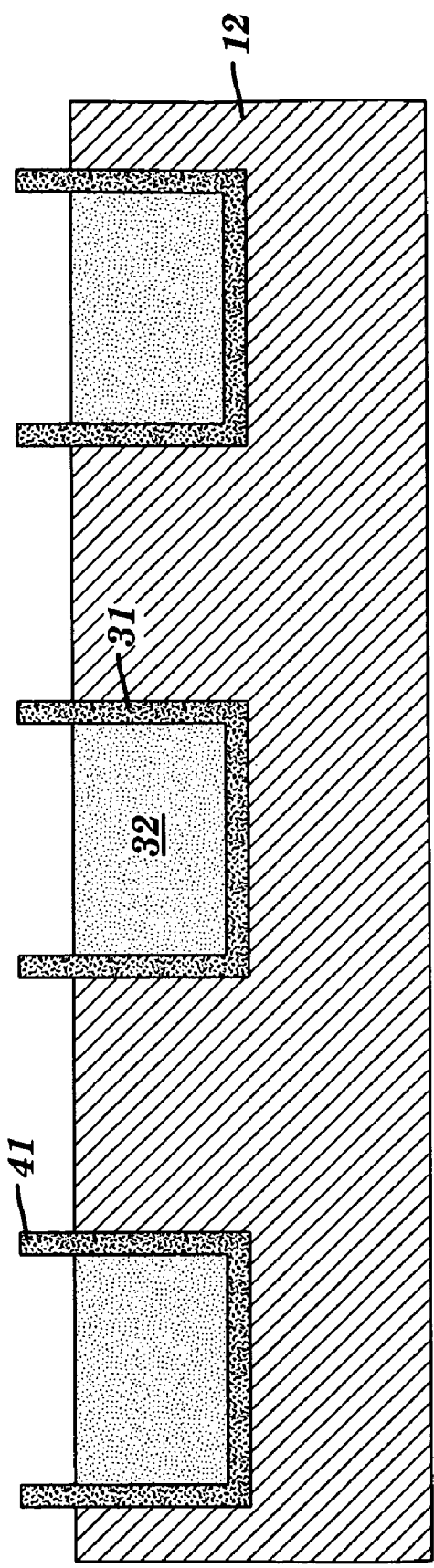

Referring now to FIG. 6 there is illustrated the removal of the sacrificial dielectric film 11. This is preferably done using a wet etch. In a preferred embodiment the wet etch is dilute HF solution. As shown in the cross section view of FIG. 6 the Cu interconnect features 32 will now be surrounded by a section 41 of the diffusion barrier layer 31 protruding above the ILD layer 12. This protruding section 41 will surround either the Cu interconnect vias or lines depending on whether a single or dual damascene structure is used. In a preferred embodiment the height of the section 41 protruding above the ILD layer 12 is approximately 5 nm to approximately 100 nm, the width will equal the diffusion barrier layer 31 deposition thickness.

As illustrated in FIGS. 5 and 6 the first wet etch is tailored to etch on the Cu interconnect. The second wet etch is tailored to etch only the sacrificial dielectric film 11.

Figure 7:
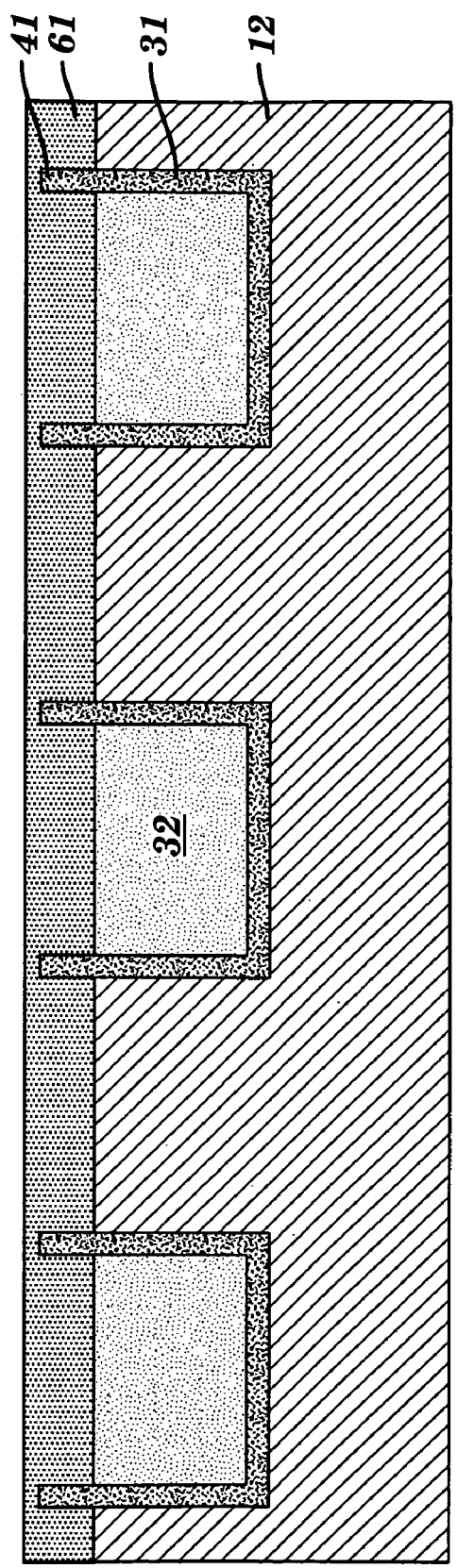

Referring now to FIG. 7 there is illustrated the deposition of a dielectric capping layer 61. In a preferred embodiment the dielectric capping layer 61 is $Si_3N_4$, SiC, SiCN, SiC(N,H) or SiCH. The dielectric capping layer 61 is preferably deposited by CVD deposition or spin-on techniques. As shown in FIG. 6, the thickness of the dielectric capping layer 61 is greater than the height of the section 41 protruding above the ILD layer 12. This results in a portion of the diffusion barrier layer 31, the section 41 protruding above the ILD layer 12, being partially embedded in the dielectric capping layer 61.

Figure 8:
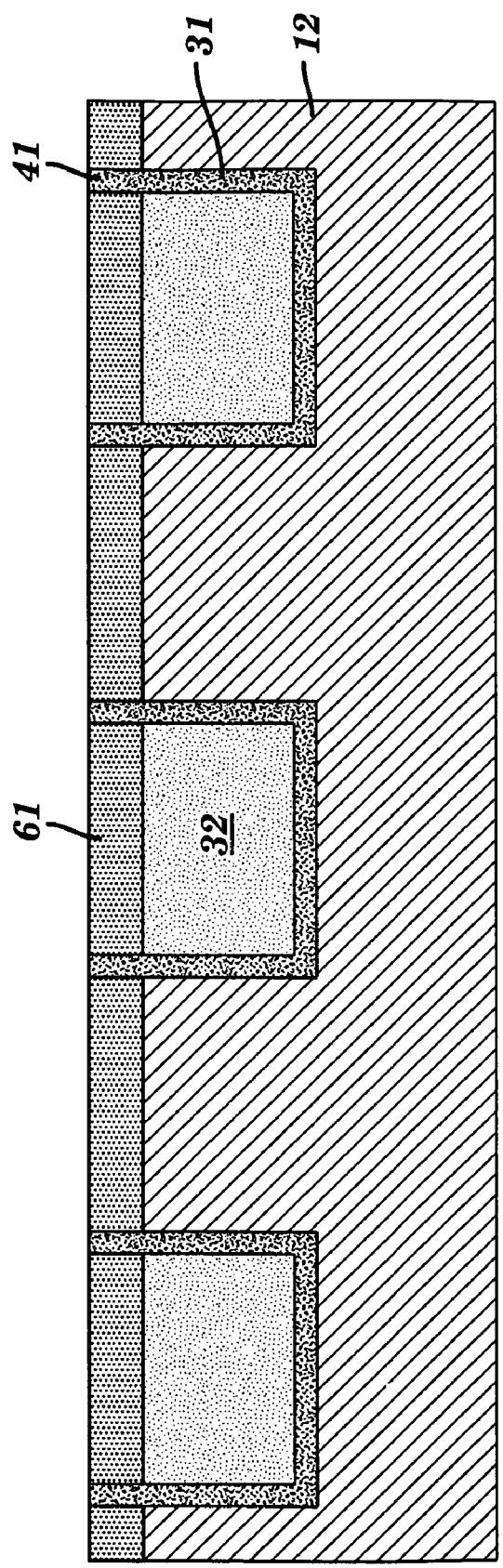

Referring now to FIG. 8 there is illustrated another embodiment of the present invention. In this embodiment an optional CMP step is performed to remove some of the thickness of the dielectric capping layer 61 in order to bring the surface of the dielectric capping layer 61 flush with the section 41 of the diffusion barrier layer 31 protruding above the ILD layer 12. This results in section 41 of the diffusion barrier layer 31 completely embedded in the dielectric capping layer 61 as shown in FIG. 8.

Figure 9:
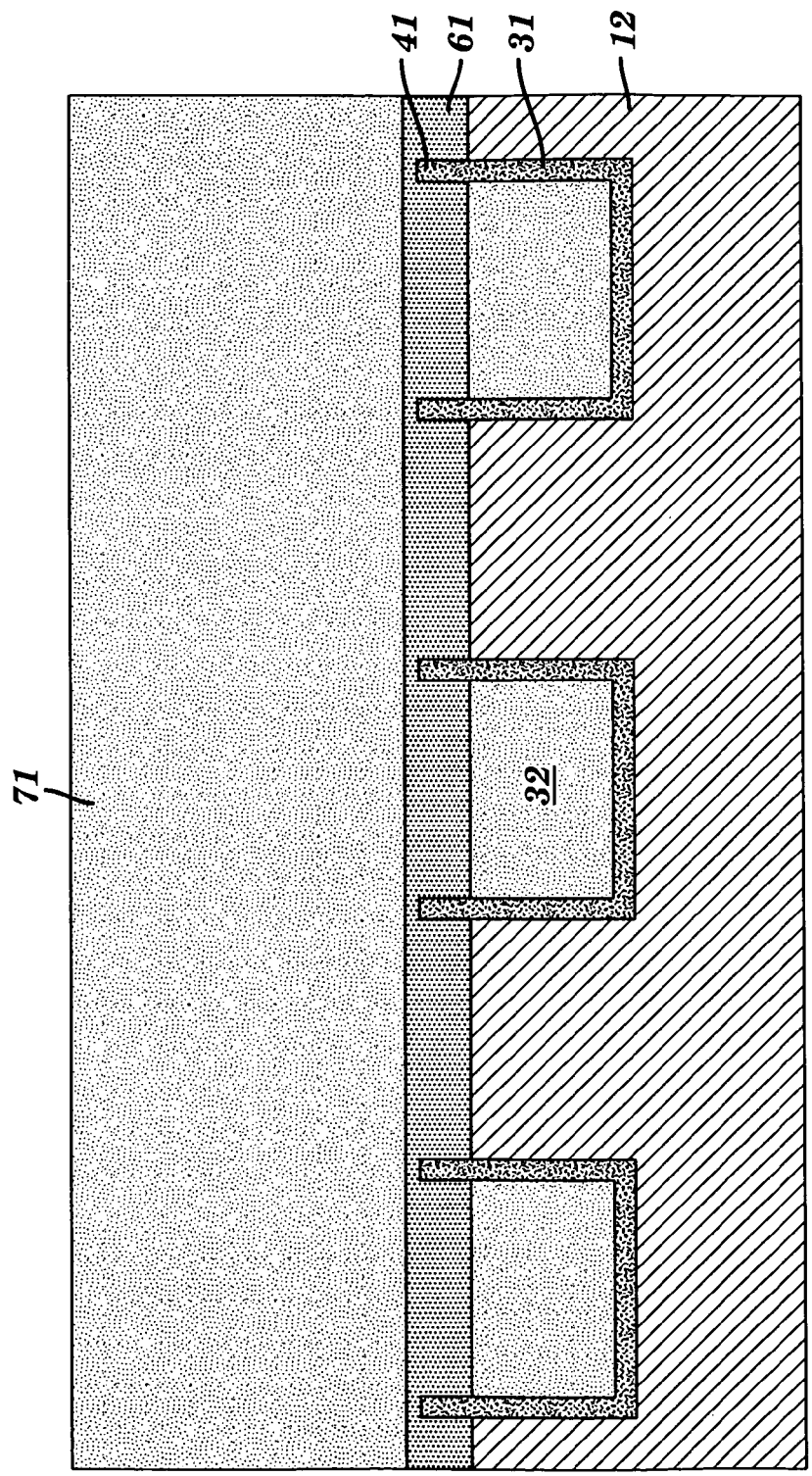
Figure 10:
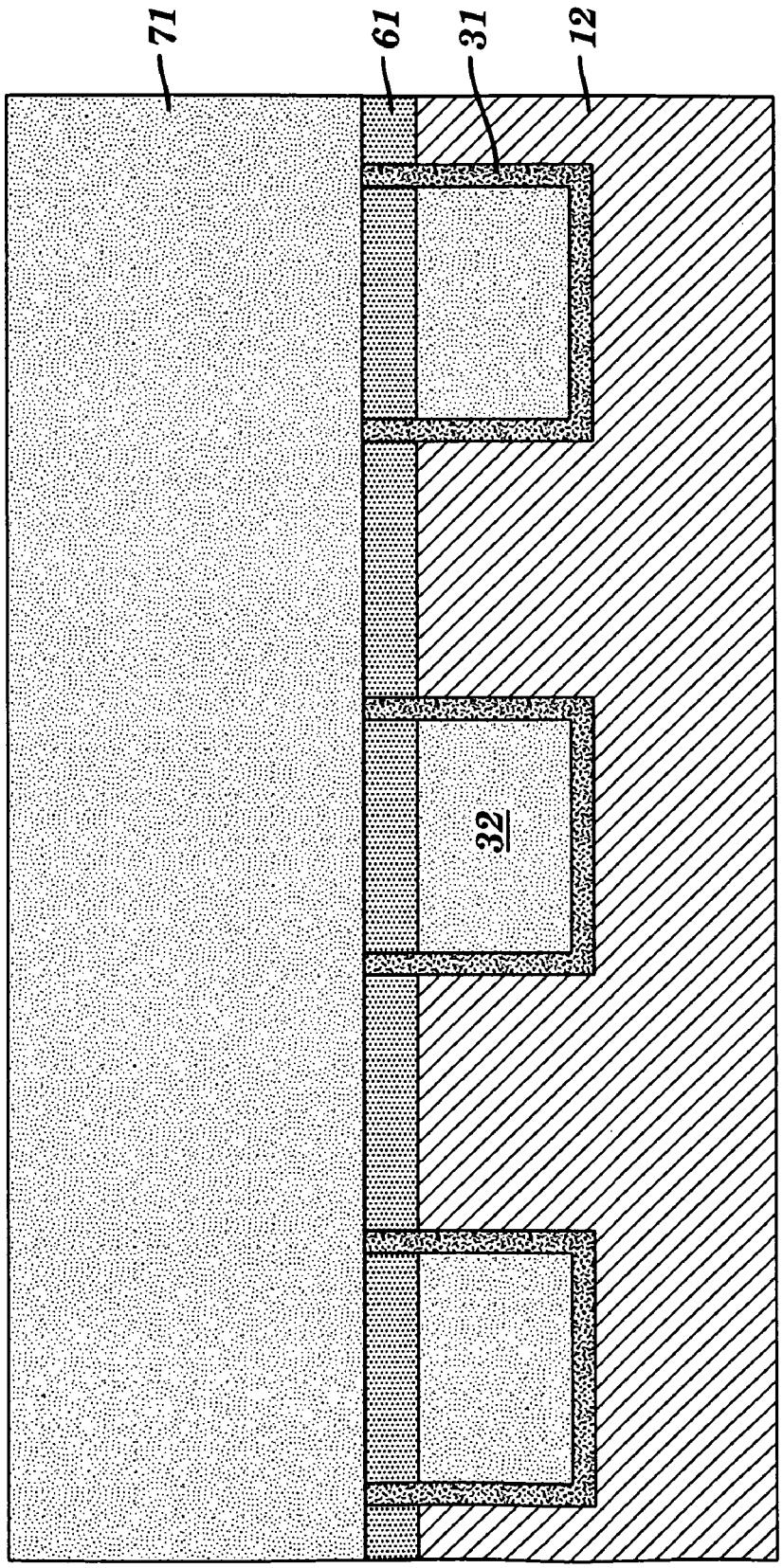

Referring now to FIG. 9 there is illustrated the deposition of ILD layer 71 for the next level interconnect build. FIG. 8 illustrates the embodiment where a portion of the diffusion barrier layer 31, the section 41 protruding above the ILD layer 12, is only partially embedded in the dielectric capping layer 61. FIG. 10 illustrates the deposition of ILD layer 71 for the next level interconnect build where the section 41 protruding above the ILD layer 12 is completely embedded in the dielectric capping layer 61.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A semiconductor device comprising;
an interconnect structure having a dielectric layer with at least one conductive interconnect embedded therein;
a diffusion barrier layer surrounding said at least one conductive interconnect and in contact with said dielectric layer and said at least one conductive interconnect;
a dielectric capping layer in contact with said dielectric layer and said at least one conductive interconnect, and
a portion of said diffusion barrier layer extending into said dielectric capping layer.

2. The semiconductor device of claim 1 wherein said portion of said diffusion barrier layer extending into said capping layer extends into only a portion of said dielectric capping layer.

3. The semiconductor device of claim 1 wherein said portion of said diffusion barrier layer extending into said capping layer extends into the entire thickness of said dielectric capping layer.

4. The semiconductor device of claim 1 wherein said at least one conductive interconnect comprises lines and vias.

5. The semiconductor device of claim 1 wherein said at least one conductive interconnect is comprised of a material selected from the group consisting of Cu, W, Al, and alloys thereof.

6. The semiconductor device of claim 1 wherein said dielectric layer has a thickness of approximately 500 Å to approximately 10,000 Å.

7. The semiconductor device of claim 1 wherein said diffusion barrier layer is comprised of a material selected from the group consisting of Ta, TaN, Ti, TiN, Ru, RuN, RuTa, RuTaN, W, and WN.

8. The semiconductor device of claim 1 wherein said diffusion barrier layer has a thickness of approximately 4 nm to approximately 40 nm.

9. The semiconductor device of claim 1 wherein said dielectric capping layer is comprised of a material selected from the group consisting of $Si_3N_4$, SiC, SiCN, SiC(N,H) and SiCH.

10. The semiconductor device of claim 1 wherein said portion of said diffusion barrier layer extending into said dielectric capping layer has a height of approximately 5 nm to approximately 100 nm.

* * * * *